(12) United States Patent
Jiang (10) Patent No.: US 11,150,527 B2
(45) Date of Patent: Oct. 19, 2021

(54) DISPLAY PANEL AND DISPLAY DEVICE

(71) Applicant: Wuhan China Star Optoelectronics Semiconductor Display Technology Co., Ltd., Hubei (CN)

(72) Inventor: Guodong Jiang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 192 days.

(21) Appl. No.: 16/318,101

(22) PCT Filed: Jan. 9, 2019

(86) PCT No.: PCT/CN2019/070924
§ 371 (c)(1),
(2) Date: Jan. 15, 2019

(87) PCT Pub. No.: WO2020/057020
PCT Pub. Date: Mar. 26, 2020

(65) Prior Publication Data
US 2021/0003894 A1    Jan. 7, 2021

(30) Foreign Application Priority Data
Sep. 18, 2018    (CN) .......................... 201811090044.2

(51) Int. Cl.
*H01L 27/12*    (2006.01)
*G02F 1/1362*    (2006.01)
*G02F 1/1345*    (2006.01)
*G02F 1/1368*    (2006.01)

(52) U.S. Cl.
CPC ...... *G02F 1/136286* (2013.01); *G02F 1/1345* (2013.01); *G02F 1/1368* (2013.01); *H01L 27/1244* (2013.01)

(58) Field of Classification Search
CPC ............ G02F 1/136286; G02F 1/1345; G02F 1/1368; G02F 1/13685; G02F 1/136227; H01L 27/1244; H01L 29/4908; H01L 29/42384–42392; H01L 2029/42388
See application file for complete search history.

(56) References Cited

U.S. PATENT DOCUMENTS

2013/0113766 A1* 5/2013 Kim ..................... G09G 3/3648
                                                                          345/205
2016/0020224 A1* 1/2016 Kawamura ........... G02F 1/1345
                                                                          345/213

FOREIGN PATENT DOCUMENTS

CN    103926764 A    7/2014
CN    105932029 A    9/2016
CN    106200162 A    12/2016
(Continued)

*Primary Examiner* — Cuong B Nguyen
(74) *Attorney, Agent, or Firm* — Hamre, Schumann, Mueller & Larson, P.C.

(57) ABSTRACT

Provided are a display panel and a display device. The display panel includes: a substrate, including a display area; a first metal layer, including a plurality of scan lines; a second metal layer, including a plurality of first traces, wherein projections of the plurality of first traces on the substrate are located in the display area; and a driving chip, wherein at least a portion of the scan lines are connected to the driver chip through the first traces.

17 Claims, 4 Drawing Sheets

(56) References Cited

FOREIGN PATENT DOCUMENTS

CN 106292103 A 1/2017
CN 107065376 A 8/2017

* cited by examiner

DISPLAY PANEL AND DISPLAY DEVICE

FIELD OF THE INVENTION

The present application relates to a display field, and more particularly to a display panel and a display device.

BACKGROUND OF THE INVENTION

With the development of the display industry, users have higher and higher requirements for terminals. For instance, the users desire that the higher the proportion of the display area of the terminal will be the better. What followed was the emergence of full-screen technology and constant development, and the non-display area (i.e., the frame) of the display was designed to be narrower and narrower.

For the display module, the area between the display area and the outer border of the display module is the non-display area (i.e., the frame) of the display module, which includes four frames of top, bottom, left and right. The non-display area is used for peripheral circuit traces. Through the non-display area, a series of thin film transistors of the display area can be connected and led out to the outer lead terminal area of the bottom frame, thereby connecting the outer lead terminal area to the driving chip. However, because of the existence of peripheral circuit traces, the frame of the display module cannot be further reduced. Therefore, a new routing method needs to be designed to solve such problem.

Technical Problem

The embodiment of the present application provides a display panel and a display device, in which a trace is disposed in a display area, thereby reducing an area occupied by a frame.

Technical Solution

The present application provides a display panel, including:
a substrate, including a display area;
a first metal layer, including a plurality of scan lines;
a second metal layer, including a plurality of first traces, wherein projections of the plurality of first traces on the substrate are located in the display area; and
a driving chip, wherein at least a portion of the scan lines are connected to the driver chip through the first traces.

In the display panel of the present application, the plurality of first traces are connected to the plurality of scan lines in one-to-one correspondence.

In the display panel of the present application, the plurality of scan lines are arranged in a first direction, and the plurality of first traces are arranged in a second direction, and the first direction and the second direction are perpendicular to each other.

In the display panel of the present application, a first insulating layer is disposed between the first metal layer and the second metal layer, and a plurality of first via holes are disposed in the first insulating layer, and one of the first traces is connected to one of the scan lines through one of the first via holes.

In the display panel of the present application, projections of the plurality of first via holes on the substrate are at junctions of projections of the plurality of scan lines on the substrate and projections of the plurality of first traces on the substrate.

In the display panel of the present application, the display panel further includes a third metal layer, wherein the third metal layer includes a plurality of second traces; projections of the plurality of second traces on the substrate are located in the display area, and a portion of the scan lines are connected to the driver chip through the plurality of second traces.

In the display panel of the present application, a second insulating layer is disposed between the first metal layer and the third metal layer, and a plurality of second via holes are disposed in the second insulating layer, and one of the second traces is connected to one of the scan lines through one of the second via holes.

In the display panel of the present application, the first metal layer is disposed between the second metal layer and the third metal layer.

In the display panel of the present application, the display panel further includes a plurality of thin film transistors, wherein gates of the plurality of thin film transistors are disposed in a same layer as the first metal layer, and one of the scan lines is connected to a gate of one of the thin film transistors.

The present application further provides a display device, including a display panel and a package cover plate disposed on the display panel, wherein the display panel includes:
a substrate, including a display area;
a first metal layer, including a plurality of scan lines;
a second metal layer, including a plurality of first traces, wherein projections of the plurality of first traces on the substrate are located in the display area; and
a driving chip, wherein at least a portion of the scan lines are connected to the driver chip through the first traces.

In the display device of the present application, the plurality of first traces are connected to the plurality of scan lines in one-to-one correspondence.

In the display device of the present application, the plurality of scan lines are arranged in a first direction, and the plurality of first traces are arranged in a second direction, and the first direction and the second direction are perpendicular to each other.

In the display device of the present application, a first insulating layer is disposed between the first metal layer and the second metal layer, and a plurality of first via holes are disposed in the first insulating layer, and one of the first traces is connected to one of the scan lines through one of the first via holes.

In the display device of the present application, projections of the plurality of first via holes on the substrate are at junctions of projections of the plurality of scan lines on the substrate and projections of the plurality of first traces on the substrate.

The present application provides a display panel, including:
a substrate, including a display area;
a first metal layer, including a plurality of scan lines;
a second metal layer, including a plurality of first traces, wherein projections of the plurality of first traces on the substrate are located in the display area; and
a driving chip, wherein at least a portion of the scan lines are connected to the driver chip through the first traces;
wherein the display panel further includes a third metal layer, and the third metal layer includes a plurality of second traces; projections of the plurality of second traces on the substrate are located in the display area, and a portion of the scan lines are connected to the driver chip through the plurality of second traces; the display panel further includes a plurality of thin film transistors, and gates of the plurality of thin film transistors are disposed in a same layer as the first metal layer, and one of the scan lines is connected to a gate of one of the thin film transistors.

In the display panel of the present application, the plurality of scan lines are arranged in a first direction, and the plurality of first traces are arranged in a second direction, and the first direction and the second direction are perpendicular to each other.

In the display panel of the present application, a first insulating layer is disposed between the first metal layer and the second metal layer, and a plurality of first via holes are disposed in the first insulating layer, and one of the first traces is connected to one of the scan lines through one of the first via holes.

In the display panel of the present application, projections of the plurality of first via holes on the substrate are at junctions of projections of the plurality of scan lines on the substrate and projections of the plurality of first traces on the substrate.

In the display panel of the present application, a second insulating layer is disposed between the first metal layer and the third metal layer, and a plurality of second via holes are disposed in the second insulating layer, and one of the second traces is connected to one of the scan lines through one of the second via holes.

In the display panel of the present application, the first metal layer is disposed between the second metal layer and the third metal layer.

Beneficial Effect

The display panel provided by the present application includes: a substrate, including a display area; a first metal layer, including a plurality of scan lines; a second metal layer, including a plurality of first traces, wherein projections of the plurality of first traces on the substrate are located in the display area; and a driving chip, wherein at least a portion of the scan lines are connected to the driver chip through the first traces. The first traces are disposed in the display area, and a layer is separately formed so that it no longer occupies the frame area, thereby greatly reducing the area occupied by the frame.

BRIEF DESCRIPTION OF THE DRAWINGS

In order to more clearly illustrate the embodiments of the present invention and the prior art, the following figures will be described in the embodiments and the prior art are briefly introduced. It is obvious that the drawings are only some embodiments of the present application, those of ordinary skill in this field can obtain other figures according to these figures without paying the premise.

DETAILED DESCRIPTION OF PREFERRED EMBODIMENTS

Figure 1:
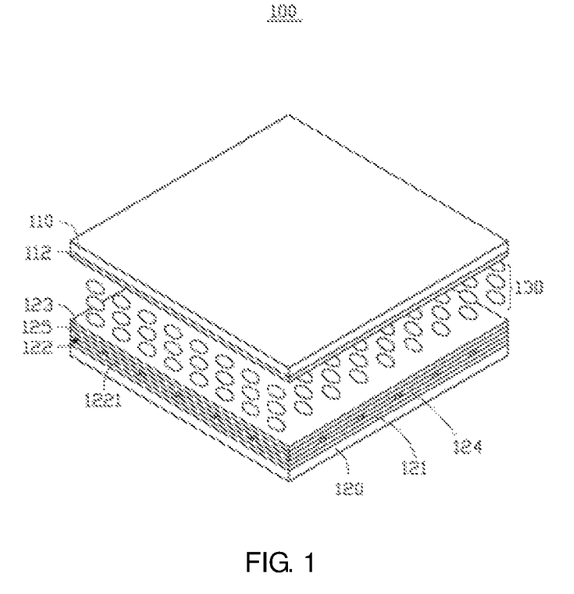
FIG. 1 is a schematic perspective structural diagram of a display panel according to an embodiment of the present application.

Please refer to FIG. 1. FIG. 1 is a schematic perspective structural diagram of a display panel according to an embodiment of the present application. As shown in FIG. 1, the display panel 100 includes a color filter substrate 110, an array substrate 120 and a liquid crystal layer 130 between the color filter substrate 110 and the array substrate 120. A side of the color filter substrate 110 adjacent to the liquid crystal layer 130 is provided with a color filter layer 112. A side of the array substrate 120 adjacent to the liquid crystal layer 130 is provided with a display driving structure 121, a common electrode layer 122 and a pixel electrode layer 123.

Figure 2:
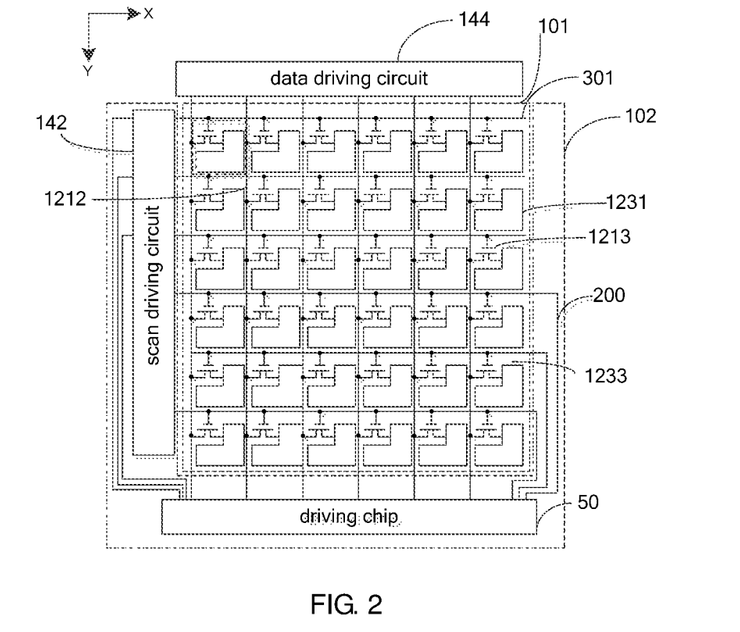
FIG. 2 is a schematic equivalent circuit diagram of a display driving structure and a pixel electrode layer according to an embodiment of the present application.

Please refer to FIG. 2, together. FIG. 2 is a schematic equivalent circuit diagram of a display driving structure and a pixel electrode layer according to an embodiment of the present application. The pixel electrode layer 123 includes pixel electrodes 1231 corresponding to respective pixels of the display panel 100. The display driving structure 121 includes a plurality of scan lines 301 disposed in the display area 101, a plurality of data lines 1212 and thin film transistors 1213 connected to intersections of the scan lines and the data lines. The thin film transistors 1213 are also electrically connected to the pixel electrodes 1231 for transmitting data signals to the pixel electrodes 1231. The common electrode layer 122 is configured to cooperate with the pixel electrodes 1231 to form a planar electric field to drive liquid crystal molecules to rotate in a plane. The scan lines 301 extend in a first direction X, and the data lines 1212 extend in a second direction Y different from the first direction X and insulated from the scan lines 301 to form a plurality of pixels 1233. The first direction X may be perpendicular to the second direction Y, such that the plurality of pixels 1233 are arranged in a matrix. Each of the pixels 1233 is provided with the thin film transistor 1213 and the pixel electrode 1231. The thin film transistor 1213 is connected to the scan line 301, the data line 1212 and the pixel electrode 1231, respectively. The pixel electrode 1231 is configured to drive the display panel 100 to perform screen display with the common electrode layer 122 during a display period.

It can be understood that the display panel 100 further includes a scan driving circuit 142 electrically connected to the scan lines 301 and a data driving circuit 144 electrically connected to the data lines 1212. The scan driving circuit 142 is configured to apply scan driving signals to the scan lines 301 during the display period, and the data driving circuit 144 is configured to apply data driving signals to the data lines 1212 during the display period.

It can be understood that the display panel 100 further includes a trace 200 and a driving chip 50 disposed in a non-display area 102, and the scan lines 301 are connected to the driving chip 50 through the trace 200.

Since the trace 200 is disposed in the non-display area 102, a frame of the display panel cannot be further reduced.

Figure 3:
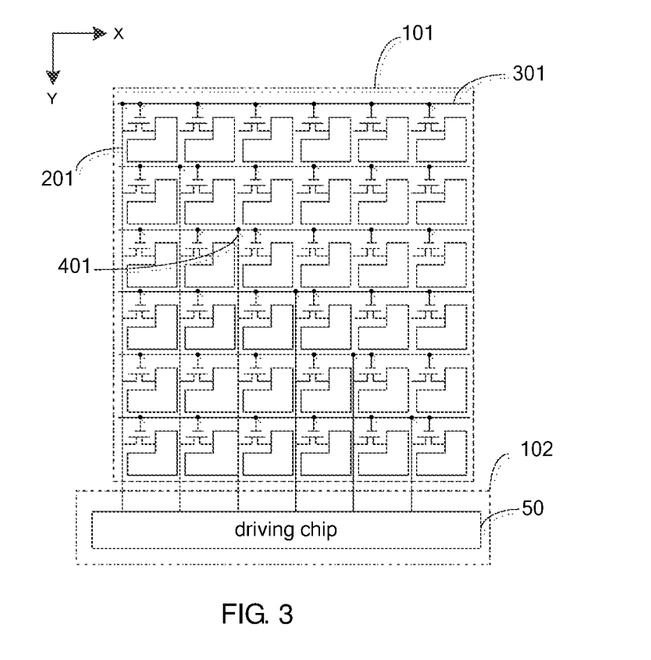
FIG. 3 is another schematic equivalent circuit diagram of a display driving structure and a pixel electrode layer according to an embodiment of the present application.
Figure 4:
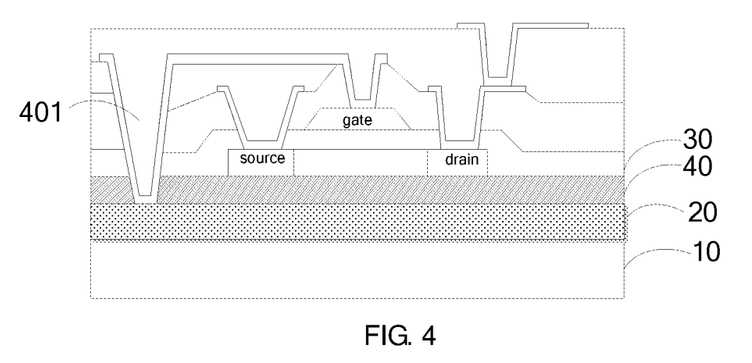
FIG. 4 is a cross-sectional diagram of a display panel according to an embodiment of the present application.

For solving the problem that the frame of the display panel cannot be further reduced, the embodiment of the present application provides a display panel. Please refer to FIG. 3 and FIG. 4. FIG. 3 is another schematic equivalent circuit diagram of a display driving structure and a pixel electrode layer according to an embodiment of the present application. FIG. 4 is a cross-sectional diagram of a display panel according to an embodiment of the present application. The display panel includes: a substrate 10, wherein the substrate includes a display area 101; a first metal layer 30, wherein the first metal layer 30 includes a plurality of scan lines 301; a second metal layer 20, wherein the second metal layer 20 includes a plurality of first traces 201, and projections of the plurality of first traces 201 on the substrate 10 are located in the display area 101; and a driving chip 50, wherein at least a portion of the scan lines 301 are connected to the driver chip 50 through the first traces 201.

The substrate 10 may be a glass substrate, a highly thermally conductive aluminum substrate or a substrate on which PI (Polyimide) is formed, or may be a TFT (Thin Film Transistor) substrate or an OLED (Organic Light Emitting Diode) substrate. As shown in FIG. 3, the substrate includes the display area 101 and a non-display area 102. The plurality of first traces 201 originally disposed in the non-display area 102 are disposed in the display area 101, thereby reducing an occupied area of the non-display area 102 and reducing a proportion of the non-display area 102. The plurality of first traces 201 are formed into a single layer, that is, the second metal layer 20. The plurality of scan lines 301 and the plurality of first traces 201 are disposed in different layers, such that the plurality of scan lines 301 and the plurality of first traces 201 do not interfere with each other. The plurality of first traces 201 are connected to the plurality of scan lines 301 in one-to-one correspondence; and the plurality of scan lines 301 are arranged along the first direction X, and the plurality of first traces 201 are arranged along the second direction Y, and the first direction X is perpendicular to the second direction Y, such that each of the first traces 201 and each of the scan lines 301 can have a largest contact area. Meanwhile, the first traces 201 cannot be entangled with each other to avoid mutual interference. Specifically, the first direction X refers to the arrangement direction of the first traces 201, and the second direction Y refers to the arrangement direction of the scan lines 301. The positions of the first traces 201 and the scan lines 301 in FIG. 3 are merely illustrative and are not intended to limit the application.

It can be understood that although not shown in FIG. 3, the scan driving circuit, the data lines and the data driving circuit are further included. The arrangement positions of the scan driving circuit, the data lines and the data driving circuit are shown in the foregoing, and are not described in detail herein.

The display panel provided by the present application includes: a substrate 10, wherein the substrate 10 includes a display area 101; a first metal layer 30, wherein the first metal layer 30 includes a plurality of scan lines 301; a second metal layer 20, wherein the second metal layer 20 includes a plurality of first traces 201, and projections of the plurality of first traces 201 on the substrate 10 are located in the display area 101; and a driving chip 50, wherein at least a portion of the scan lines 301 are connected to the driver chip 50 through the first traces 201, and the first traces 201 are disposed in the display area 101, and a layer is separately formed so that it no longer occupies the frame area, thereby greatly reducing the area occupied by the frame.

As shown in FIG. 4, in some embodiments, a first insulating layer 40 is disposed between the first metal layer 30 and the second metal layer 20, such that the first metal layer 30 and the second metal layer 20 are insulated from each other; a plurality of first via holes 401 are disposed in the first insulating layer 40, and one of the first traces 201 is connected to one of the scan lines 301 through one of the first via holes 401. Moreover, projections of the plurality of first via holes 401 on the substrate 10 are at junctions of projections of the plurality of scan lines 301 on the substrate 10 and projections of the plurality of first traces 201 on the substrate 10.

Figure 5:
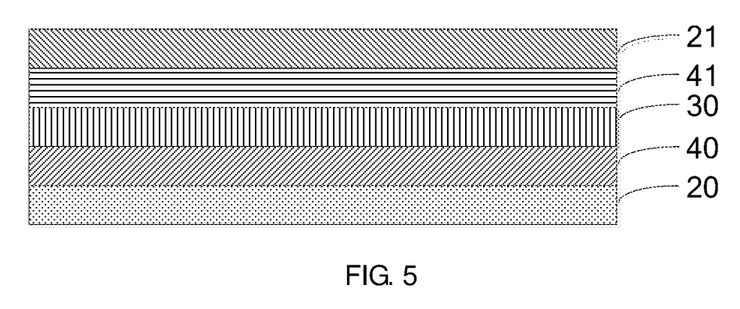
FIG. 5 is another cross-sectional diagram of a display panel according to an embodiment of the present application.
Figure 6:
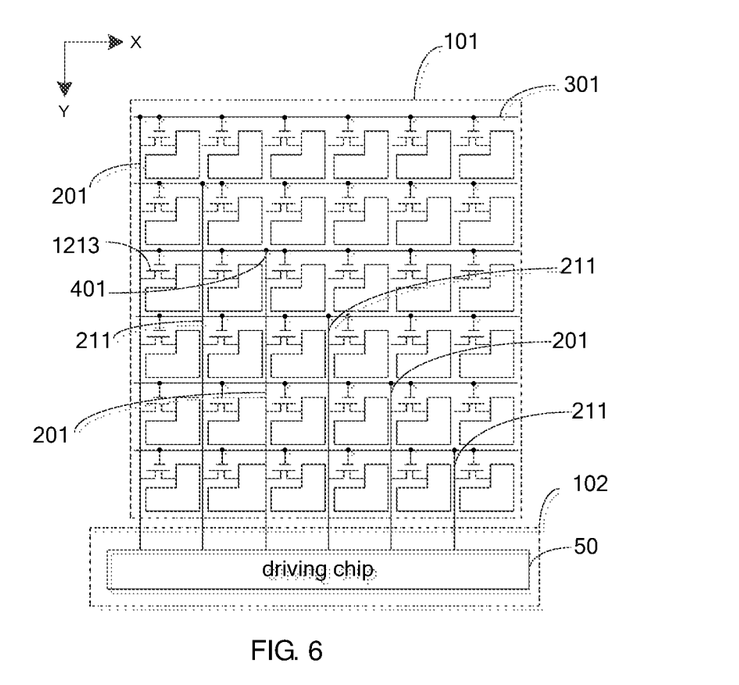
FIG. 6 is one another schematic equivalent circuit diagram of a display driving structure and a pixel electrode layer according to an embodiment of the present application.

Please refer to FIG. 5 and FIG. 6. FIG. 5 is another cross-sectional diagram of a display panel according to an embodiment of the present application. FIG. 6 is one another schematic equivalent circuit diagram of a display driving structure and a pixel electrode layer according to an embodiment of the present application. The display panel further includes:

a third metal layer 21, wherein the third metal layer 21 includes a plurality of second traces 211; projections of the plurality of second traces 211 on the substrate 10 are located in the display area 101, and a portion of the scan lines 301 are connected to the driver chip 50 through the plurality of second traces 211. Since a portion of the scan lines 301 are connected to the driver chip 50 through the plurality of second traces 211, a number of scan lines 301 is the same as an added number of the first traces 201 and the second traces 211. One of the first traces 201 of the second metal layer 20 is connected to one of every two scan lines 301. One of the second traces 211 of the third metal layer 21 is connected to the other one of every two scan lines 301. For instance, if there are 6 scan lines 301 of 1, 2, 3, 4, 5 and 6, then the three scan lines 301 of 1, 3, 5 are connected to the first traces 201; the three scan lines of 2, 4, and 6 are connected to the second traces 211. Thus, the distances between the respective first traces 201 and the respective second traces 211 are increased, so that the first traces 201 and the second traces 211 are not short-circuited or not entangled with each other.

A second insulating layer 41 is disposed between the first metal layer 30 and the third metal layer 21, such that the first metal layer 30 and the third metal layer 21 are insulated from each other. A plurality of second via holes 411 are disposed in the second insulating layer 41, and one of the second traces 211 is connected to one of the scan lines 301 through one of the second via holes 411. The first metal layer 30 is disposed between the second metal layer 20 and the third metal layer 21. The display panel further includes a plurality of thin film transistors 1213, wherein gates of the plurality of thin film transistors 1213 are disposed in a same layer as the first metal layer 30, and one of the scan lines 301 is connected to a gate of one of the thin film transistors 1213.

It can be understood that although not shown in FIG. 6, the scan driving circuit, the data lines and the data driving circuit are further included. The arrangement positions of the scan driving circuit, the data lines and the data driving circuit are shown in the foregoing, and are not described in detail herein.

The present application further provides a display device, including a display panel of any embodiment of the present application and a package cover plate disposed on the display panel.

The display panel provided by the present application further includes: a third metal layer 21, wherein the third metal layer 21 includes a plurality of second traces 211; projections of the plurality of second traces 211 on the substrate 10 are located in the display area 101, and a portion of the scan lines 301 are connected to the driver chip 50 through the plurality of second traces 211. The second traces 211 are disposed on the upper side and lower side of the first metal layer 30 by dividing the second traces into two or more metal layers, and the second traces 211 are connected to the scan lines 301 through the second via holes 411. Thus, the distances between the respective first traces 201 and the respective second traces 211 are increased, so that the first traces 201 and the second traces 211 are not short-circuited or not entangled with each other.

The display panel and the display device provided by the embodiments of the present application are described in detail. The principles and implementations of the present application are described in the specific examples. The description of the above embodiments is only for helping to understand the present application. Meanwhile, those skilled in the art will be able to change the specific embodiments and the scope of the application according to the idea of the present application. In conclusion, the content of the specification should not be construed as limiting the present application.

What is claimed is:

1. A display panel, including:
   a substrate, including a display area;
   a first metal layer, including a plurality of scan lines;
   a second metal layer, including a plurality of first traces, wherein projections of the plurality of first traces on the substrate are located in the display area;
   a driving chip, wherein a first portion of the scan lines are connected to the driver chip through the first traces; and
   a third metal layer, wherein the third metal layer includes a plurality of second traces; projections of the plurality of second traces on the substrate are located in the display area, and a second portion of the scan lines are connected to the driver chip through the plurality of second traces,
   wherein the first metal layer is disposed between the second metal layer and the third metal layer.

2. The display panel according to claim 1, wherein the plurality of first traces are connected to the plurality of scan lines in one-to-one correspondence.

3. The display panel according to claim 2, wherein the plurality of scan lines are arranged in a first direction, and the plurality of first traces are arranged in a second direction, and the first direction and the second direction are perpendicular to each other.

4. The display panel according to claim 3, wherein a first insulating layer is disposed between the first metal layer and the second metal layer, and a plurality of first via holes are disposed in the first insulating layer, and one of the plurality of first traces is connected to one of the plurality of scan lines through one of the plurality of first via holes.

5. The display panel according to claim 4, wherein projections of the plurality of first via holes on the substrate are at junctions of projections of the plurality of scan lines on the substrate and projections of the plurality of first traces on the substrate.

6. The display panel according to claim 1, wherein a second insulating layer is disposed between the first metal layer and the third metal layer, and a plurality of second via holes are disposed in the second insulating layer, and one of the plurality of second traces is connected to one of the plurality of scan lines through one of the plurality of second via holes.

7. The display panel according to claim 1, further including a plurality of thin film transistors, wherein gates of the plurality of thin film transistors are disposed in a same layer as the first metal layer, and one of the plurality of scan lines is connected to a gate of one of the plurality of thin film transistors.

8. A display device, including a display panel and a package cover plate disposed on the display panel, wherein the display panel includes:
   a substrate, including a display area;
   a first metal layer, including a plurality of scan lines;
   a second metal layer, including a plurality of first traces, wherein projections of the plurality of first traces on the substrate are located in the display area;
   a driving chip, wherein a first portion of the scan lines are connected to the driver chip through the first traces; and
   a third metal layer, wherein the third metal layer includes a plurality of second traces; projections of the plurality of second traces on the substrate are located in the display area, and a second portion of the scan lines are connected to the driver chip through the plurality of second traces,
   wherein the first metal layer is disposed between the second metal layer and the third metal layer.

9. The display device according to claim 8, wherein the plurality of first traces are connected to the plurality of scan lines in one-to-one correspondence.

10. The display device according to claim 9, wherein the plurality of scan lines are arranged in a first direction, and the plurality of first traces are arranged in a second direction, and the first direction and the second direction are perpendicular to each other.

11. The display device according to claim 10, wherein a first insulating layer is disposed between the first metal layer and the second metal layer, and a plurality of first via holes are disposed in the first insulating layer, and one of the plurality of first traces is connected to one of the plurality of scan lines through one of the plurality of first via holes.

12. The display device according to claim 11, wherein projections of the plurality of first via holes on the substrate are at junctions of projections of the plurality of scan lines on the substrate and projections of the plurality of first traces on the substrate.

13. A display panel, including:
   a substrate, including a display area;
   a first metal layer, including a plurality of scan lines;
   a second metal layer, including a plurality of first traces, wherein projections of the plurality of first traces on the substrate are located in the display area; and
   a driving chip, wherein a first portion of the scan lines are connected to the driver chip through the first traces;
   wherein the display panel further includes a third metal layer, and the third metal layer includes a plurality of second traces; projections of the plurality of second traces on the substrate are located in the display area, and a second portion of the scan lines are connected to the driver chip through the plurality of second traces; the display panel further includes a plurality of thin film transistors, and gates of the plurality of thin film transistors are disposed in a same layer as the first metal layer, and one of the scan lines is connected to a gate of one of the thin film transistors,
   wherein the first metal layer is disposed between the second metal layer and the third metal layer.

14. The display panel according to claim 13, wherein the plurality of scan lines are arranged in a first direction, and the plurality of first traces are arranged in a second direction, and the first direction and the second direction are perpendicular to each other.

15. The display panel according to claim 14, wherein a first insulating layer is disposed between the first metal layer and the second metal layer, and a plurality of first via holes are disposed in the first insulating layer, and one of the plurality of first traces is connected to one of the plurality of scan lines through one of the plurality of first via holes.

16. The display panel according to claim 15, wherein projections of the plurality of first via holes on the substrate are at junctions of projections of the plurality of scan lines on the substrate and projections of the plurality of first traces on the substrate.

17. The display panel according to claim 13, wherein a second insulating layer is disposed between the first metal layer and the third metal layer, and a plurality of second via holes are disposed in the second insulating layer, and one of the plurality of second traces is connected to one of the plurality of scan lines through one of the plurality of second via holes.

* * * * *